(12) United States Patent
Nakamoto

(10) Patent No.: US 6,946,691 B2
(45) Date of Patent: Sep. 20, 2005

(54) FIELD EFFECT TRANSISTOR

(75) Inventor: Takahiro Nakamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/828,322

(22) Filed: Apr. 21, 2004

(65) Prior Publication Data

US 2004/0211977 A1 Oct. 28, 2004

(30) Foreign Application Priority Data

Apr. 25, 2003 (JP) ........................................ 2003-121386

(51) Int. Cl.$^7$ ............................................. H01L 31/0304
(52) U.S. Cl. ................................... 257/192; 257/183
(58) Field of Search ................................ 257/183, 192

(56) References Cited

U.S. PATENT DOCUMENTS

| | | | | |
|---|---|---|---|---|
| 5,283,448 A | * | 2/1994 | Bayraktaroglu | 257/194 |
| 5,284,782 A | * | 2/1994 | Jeong et al. | 438/172 |
| 6,057,566 A | | 5/2000 | Eisenbeiser et al. | 257/192 |
| 6,365,925 B2 | * | 4/2002 | Hase et al. | 257/194 |
| 2002/0008249 A1 | * | 1/2002 | Minetani | 257/192 |
| 2004/0137673 A1 | * | 7/2004 | Passlack et al. | 438/197 |

OTHER PUBLICATIONS

R. E. Williams, et al. "Graded Channel FET's: Improved Linearity and Noise Figure", IEEE Transactions on Electron Devices, vol. ED–25, No. 6, Jun. 1978, pp. 600–605.
James A. Adams, et al. "Short–Channel Effects and Drain–Induced Barrier Lowering in Nanometer–Scale GaAs MESFET's", IEEE Transactions on Electron Devices, vol. 40, No. 6, Jun. 1993, pp. 1047–1052.

* cited by examiner

Primary Examiner—Allan R. Wilson
(74) Attorney, Agent, or Firm—Oblon, Spivak, McClelland, Maier & Neustadt, P.C.

(57) ABSTRACT

An MESFET is configured wherein a semiconductor layer structure including an i-AlGaAs buffer layer, an n-AlGaAs electron supply layer having an impurity doping density ranging from $1 \times 10^{17}$ cm$^{-3}$ to $1 \times 10^{18}$ cm$^{-3}$ and a layer thickness ranging from 1 nm to 10 nm, and an n-GaAs channel layer, all of which are sequentially deposited from the semi-insulating GaAs substrate side, is disposed on the semi-insulating GaAs substrate, a gate electrode is provided on the n-GaAs channel layer, and a source electrode and a drain electrode opposite to each other with the gate electrode interposed therebetween are provided.

4 Claims, 3 Drawing Sheets

FIELD EFFECT TRANSISTOR

BACKGROUND OF THE INVENTION

1. Field of the Invention

The present invention relates to a field effect transistor, and particularly to a field effect transistor used in a high output amplifier of a mobile communication base station, an artificial satellite or the like.

2. Description of the Related Art

The quality of transferred sound, and the like, as well as merely, reduction in size and weight, become important point in the development of a recent portable terminal such as a cellular phone. There is a need to transfer a signal with less distortion upon improving sound quality. It is important for a high output power amplifier such as a mobile communication base station to provide a less reduction in distortion at its amplifying characteristic in addition to gain as one important item for achieving the above. Similarly, a satellite's onboard high output amplifier used in satellite communications or the like needs to be simply brought into not only less weight and a gain increase but also into a less reduction in distortion at its amplifying characteristic.

These high output power amplifiers make use of lots of field effect transistors using compound semiconductors in conjunction with their speed properties or speedability. For instance, a MESFET (MEtal Semiconductor FET) using a GaAs channel has been widely used.

As a known example of the MESFET using GaAs, an example has been disclosed which shows an MESFET configured, with a gate length ranging from 40 nm to 300 nm, using a laminated structure wherein a buffer layer corresponding to an undoped Al0.3Ga0.7As layer whose thickness is 200 nm, is provided on an undoped GaAs layer having a thickness of 700 nm, and an Si-doped GaAs channel layer (active layer) whose thickness is set as 50 nm with recesses provided thereon and having a doping density of $4 \times 10^{18}$ cm$^{-3}$, is provided thereon (see, for example, "Short-Channel Effects and Drain-Induced Barrier Lowering in Nanometer-Scale GaAs MESFET's", James A. Adams et Al., IEEE TRANSACTIONS ON ELECTRON DEVICES, VOL. 40, NO. 6, JUNE 1993, pp. 1047–1052; the left-hand section in Page 1048).

The conventional MESFET is provided with a buffer layer in close contact with an n-GaAs channel layer, which corresponds to an undoped AlGaAs layer higher than the n-GaAs channel layer in energy level at conduction band. Owing to such a configuration, the diffusion of electrons in the n-GaAs channel layer into the buffer layer allows prevention of at least expansion of an electron distribution in the vicinity of the interface between the n-GaAs channel layer and the buffer layer and deterioration of mutual conductance (gm) and drain conductance (gd).

In the present configuration, however, an electron distribution in a thickness direction of the n-GaAs channel layer simply shows a flat distribution. Therefore, when a bias corresponding to a negative voltage is applied to a gate electrode to thereby spread a depletion layer into the n-GaAs channel layer, the depletion layer is relatively small and hence no particular problem occurs in the migration of electrons, where the absolute value of the bias corresponding to the negative voltage is low. However, a problem arises in that when the absolute value of the gate bias corresponding to the negative voltage becomes large and thereby reaches near pinch off, degradation of linearity of mutual conductance (gm) and deterioration of drain conductance (gd) occur.

Incidentally, it has already been pointed out that it is effective to increase the density of electrons in the vicinity of an interface between a channel layer and a buffer layer and on the channel layer side in order to ensure the linearity of mutual conductance (gm) (see "Graded Channel FET's: Improved Linearity and Noise Figure", R. E. WILLIAMS et Al., IEEE TRANSACTIONS ON ELECTRON DEVICES, VOL. ED-25, NO. 6, JUNE 1978, pp. 600–605; the left-hand section in Page 602).

SUMMARY OF THE INVENTION

The present invention has been made to solve the foregoing problems. A first object of the present invention is to configure a field effect transistor which suppresses degradation of linearity of mutual conductance (gm) and provides satisfactory drain conductance (gd), even when a gate bias that reaches near pinch off is applied.

According to one aspect of the invention, there is provided a field effect transistor according to the present invention comprising: a semi-insulating semiconductor substrate; a semiconductor layer structure provided on the semiconductor substrate, the semiconductor layer structure including a non-doped first compound semiconductor layer, an n-type second compound semiconductor layer having an impurity doping density ranging from $1 \times 10^{17}$ cm$^{-3}$ to $1 \times 10^{18}$ cm$^{-3}$ and a layer thickness ranging from 1 nm to 10 nm and having an energy level at a lower end of a conduction band thereof, which is less than or equal to an energy level at a lower end of a conduction band of the first compound semiconductor layer, and an n-type third compound semiconductor layer having an energy level at a lower end of a conduction band thereof, which is less than the energy level at the lower end of the conduction band of the second compound semiconductor layer, the non-doped first compound semiconductor layer, the n-type second compound semiconductor layer and the n-type third compound semiconductor layer being sequentially disposed on the semiconductor substrate from the semiconductor substrate side; and a gate electrode disposed on the semiconductor layer structure, and a source electrode and a drain electrode, the source electrode and the drain electrode being opposite to each other with the gate electrode interposed therebetween and being disposed over the semiconductor layer structure. Owing to the configuration referred to above, the second compound semiconductor layer is perfectly depleted. To this end, electrons in the second compound semiconductor layer are diffused into the third compound semiconductor layer side in the neighborhood of an interface between the second compound semiconductor layer and the third compound semiconductor layer. Thus, an electron density distribution at the third compound semiconductor layer in the vicinity of the interface between the second compound semiconductor layer and the third compound semiconductor layer is enhanced.

Accordingly, the present invention is advantageous in that the degradation in linearity of mutual conductance (gm) is suppressed even in a bias voltage region in which the absolute value of a gate bias corresponding to a negative voltage becomes large and thereby reaches near pinch off, and further in that a satisfactory value of drain conductance (gd) can be obtained.

By extension, a high output amplifier good in amplifying characteristic and having less distortion can be provided at low cost in the simple configuration that an electron supply layer is interposed between a buffer layer and a channel layer.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

The following preferred embodiments of the invention will be explained using MESFETs as one examples of field effect transistors respectively.

First Embodiment

Figure 1:
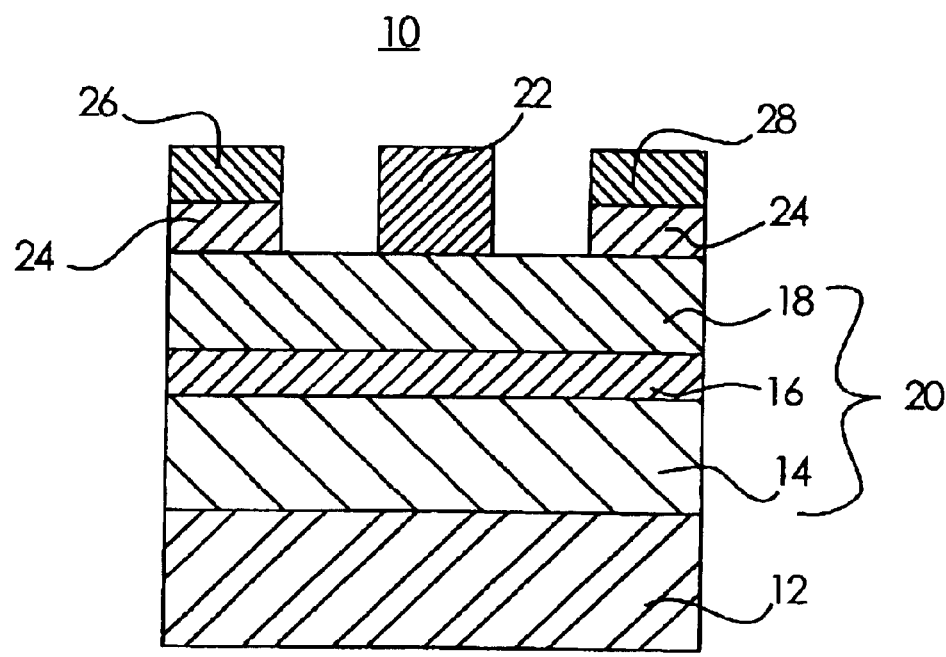
FIG. 1 is a cross-sectional view of a field effect transistor according to an embodiment of the present invention.

FIG. 1 is a cross-sectional view of a field effect transistor according to an embodiment of the present invention.

In FIG. 1, the MESFET 10 makes use of a semi-insulating GaAs substrate 12 used as a semi-insulating semiconductor substrate. In the MESFET 10, a non-doped AlGaAs buffer layer 14 (hereinafter, the term non-doped is expressed in "i-" and the term n conductivity type is expressed in "n-") used as a non-doped first compound semiconductor layer is disposed on the GaAs substrate 12. The thickness Tb of the buffer layer 14 ranges from about 10 nm to about 500 nm. An electron supply layer 16 made of n-AlGaAs, which is used as a second compound semiconductor layer, is provided on the buffer layer 14.

The electron supply layer 16 is one formed on condition that a doping impurity is Si, an impurity doping density Nde is set to $1 \times 10^{17}$ cm$^{-3}$ to $1 \times 10^{18}$ cm$^{-3}$ (e.g., $1 \times 10^{17}$ is hereinafter expressed in 1E17), more preferably, 1.5E17 cm$^{-3}$ to 5E17 cm$^{-3}$, and the thickness Te of the electron supply layer 16 is set to a range of about 1 nm to about 10 nm.

An n-GaAs channel layer 18 used as a third compound semiconductor layer is disposed on the electron supply layer 16. In the channel layer 18, the thickness Tc thereof ranges from 10 nm to 50 nm, a doping impurity is Si, and an impurity doping density Ndc ranges from about 5E16 cm$^{-3}$ to about 1E18 cm$^{-3}$.

Assuming that in regard to the buffer layer 14, the electron supply layer 16 and the channel layer 18, an energy level at a lower end of a conduction band of the buffer layer 14 is Ec(b), an energy level at a lower end of a conduction band of the electron supply layer 16 is Ec(e), and an energy level at a lower end of a conduction band of the channel layer 18 is Ec(c), there is a need to establish the following relation:

$$Ec(b) \geq Ec(e) > Ec(c) \quad (1)$$

The electron supply layer 16 needs to be completely depleted. It is necessary that the following expressions are established between the impurity doping densities and between the layer thicknesses respectively:

$$Nde \geq Ndc \quad (2)$$

$$Tb, Tc > Te \quad (3)$$

Both the buffer layer 14 and the electron supply layer 16 make use of AlGaAs in the present embodiment. However, an Al composition ratio of the buffer layer 14 is equivalent to or greater than an Al composition ratio of the electron supply layer 16. That is, the energy level at the lower end of the conduction band of the buffer layer 14 is set to be equivalent to or greater than that of the electron supply layer 16.

A semiconductor laminated structure 20 used as a semiconductor structure is formed of the buffer layer 14, the electron supply layer 16 and the channel layer 18.

A gate electrode 22 is Schottky-bonded onto the surface of the channel layer 18 of the semiconductor laminated structure 20. A contact layer 24 provided on the surface of the channel layer 18 is provided on both sides of the gate electrode 22 with the gate electrode 22 interposed therebetween. A source electrode 26 and a drain electrode 28 are ohmic-bonded onto the surface of the channel layer 18 of the semiconductor laminated structure 20 with the contact layer 24 interposed therebetween.

The contact layer 24 is formed of GaAs doped in high density with the doping impurity as Si.

A rough outline of a method of manufacturing the MESFET 10 is as follows:

An i-AlGaAs layer used as a buffer layer 14, an n-AlGaAs layer used as an electron supply layer 16, and an n-GaAs layer used as a channel layer 18 are sequentially laminated over a semi-insulating GaAs substrate 12 by, for example, MOCVD or the like to form a semiconductor laminated structure 20. Further, an n-GaAs layer used as a contact layer 24 is formed on the semiconductor laminated structure 20.

Next, the contact layer 24 is etched to form an opening that exposes the channel layer 18 in order to provide a gate electrode 22.

After that, the gate electrode 22 is evaporated onto the exposed surface of the channel layer 18 via the exposed opening. Then, a source electrode 26 and a drain electrode 28 are formed on the contact layer 24 in such a manner that they are opposed to each other with the gate electrode 22 interposed therebetween.

Figure 2:
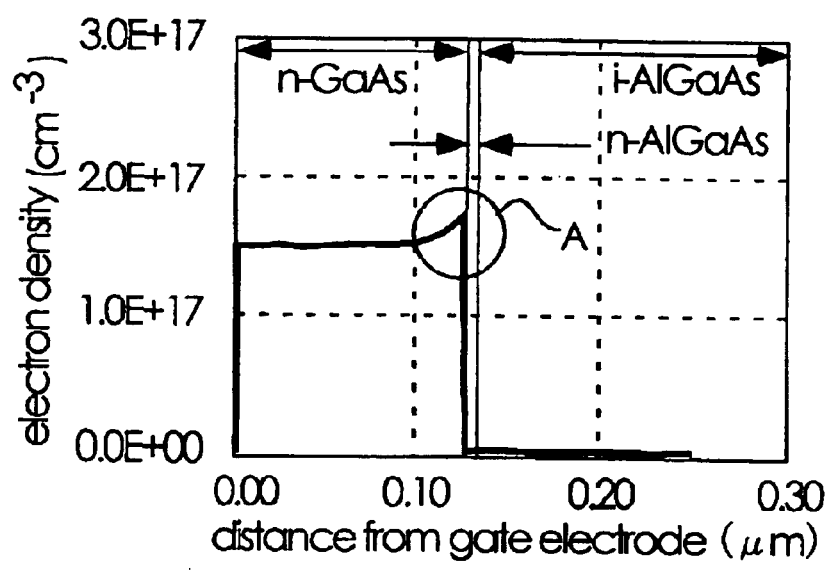
FIG. 2 is a graph showing an electron density distribution obtained in the semiconductor laminated structure of the field effect transistor according to an embodiment of the present invention.

FIG. 2 is a graph showing an electron density distribution obtained in the semiconductor laminated structure of the field effect transistor according to an embodiment of the present invention.

In FIG. 2, the vertical axis indicates an electron density, and the horizontal axis indicates the distance from the gate electrode. In the semiconductor laminated structure 20, the channel layer 18 is adjacent to the buffer layer 14 with the electron supply layer 16 interposed therebetween. The channel layer 18 is formed of n-GaAs. In the present embodiment, the buffer layer 14 is formed of AlGaAs having an Al composition ratio equivalent to that of the electron supply layer 16. Thus, since the energy level at the lower end of the conduction band of the channel layer 18 is lower than each energy levels at the lower end of the conduction band of the respective buffer layer 14 and electron supply layer 16, the electron density of the buffer layer 14 is extremely low and the electron density of the channel layer 18 is substantially uniformly distributed to a predetermined height.

Further, the channel layer 18 and the buffer layer 14 are adjacent to each other with the electron supply layer 16. The electron supply layer 16 is one in which its impurity doping density Nde is set to a range of $1E17$ $cm^{-3}$ to $1E18$ $cm^{-3}$ and its layer thickness Te is set to a range of about 1 nm to about 10 nm. Therefore, the electrons in the electron supply layer 16 are diffused into the adjacent channel layer 18 low in bandgap energy, so that the electron supply layer 16 is completely depleted. As a result, the electron density of the channel layer 18 becomes high in the neighborhood of the interface between the channel layer 18 and the electron supply layer 16. This portion corresponds to a portion A surrounded by a circle in the graph shown in FIG. 2.

When the MESFET 10 is used as an amplifier circuit, for instance, the source electrode 26 is grounded and a bias corresponding to a negative voltage is applied to the drain electrode 28 between the source electrode 26 and the drain electrode 28. Further, a bias corresponding to a negative voltage is applied to the gate electrode 22 between the source electrode 26 and the gate electrode 22.

Since, at this time, a depletion region formed in the channel layer 18 is small when the absolute value of the gate voltage is small, the electrons are easily migrated. When, however, the absolute value of the gate bias corresponding to the negative voltage becomes large and reaches near pinch off, a channel gap becomes narrow.

Since the electron density is uniform even at both the channel layer in the neighborhood of the buffer layer and other portion of the channel layer in the case of the conventional MESFET, degradation in linearity of mutual conductance (gm) and deterioration of drain conductance (gd) have occurred when the bias voltage reaches near the pinch off.

In the MESFET 10 according to the present invention, however, the electrons of the electron supply layer 16 are diffused into the channel layer 18 as indicated by the portion A in FIG. 2. Therefore, the electron density of the channel layer 18 in the vicinity of the electron supply layer 16 is enhanced.

Thus, even in the region of the bias voltage near the pinch off, the degradation in the linearity of the mutual conductance (gm) is suppressed, and a satisfactory value of the drain conductance (gd) can be obtained.

A high output amplifier good in amplifying characteristic and having less distortion can be provided at low cost in the simple configuration that the electron supply layer 16 is added between the channel layer 18 and the buffer layer 14 by extension.

Modification 1

Figure 3:
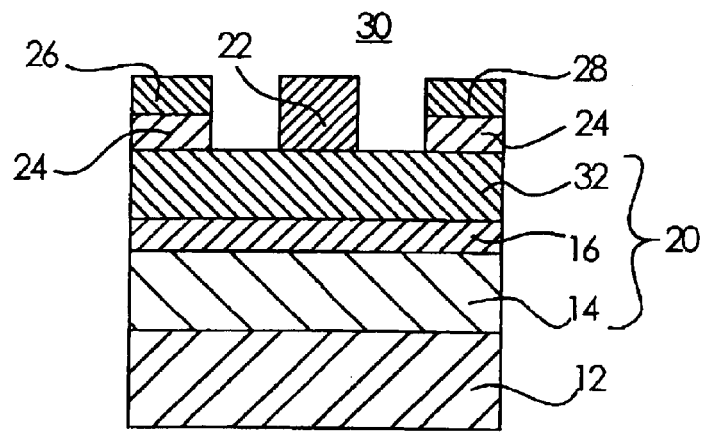
FIG. 3 is a cross-sectional view of a field effect transistor illustrative of one modification of an embodiment of the present invention.

FIG. 3 is a cross-sectional view of a field effect transistor illustrative of one modification of an embodiment of the present invention. In FIG. 3, the same reference numerals as those shown in FIG. 1 are the same ones or equivalent ones. Further, the following respective drawings are also similar to the above.

In FIG. 3, the MESFET 30 is different from the MESFET 10 shown in FIG. 1 in that the MESFET 30 makes use of an n-InGaAs channel layer 32 as an alternative to the n-GaAs channel layer 18 of the MESFET 10. The MESFET 30 is identical to the MESFET 10 in other configuration.

Even in the case where the n-InGaAs channel layer 32 is used, the channel layer 32 is set in such a manner that its layer thickness Tc ranges from 10 nm to 50 nm, a doping impurity is taken as Si, and an impurity doping density thereof ranges from about $5E16$ $cm^{-3}$ to about $1E18$ $cm^{-3}$.

Therefore, the relations among the expressions (1), (2) and (3) are satisfied.

In the present MESFET 30, InGaAs used in the channel layer 32 becomes higher in electron mobility than GaAs. Accordingly, the gain becomes large with an increase in conductance (gm).

Modification 2

Figure 4:
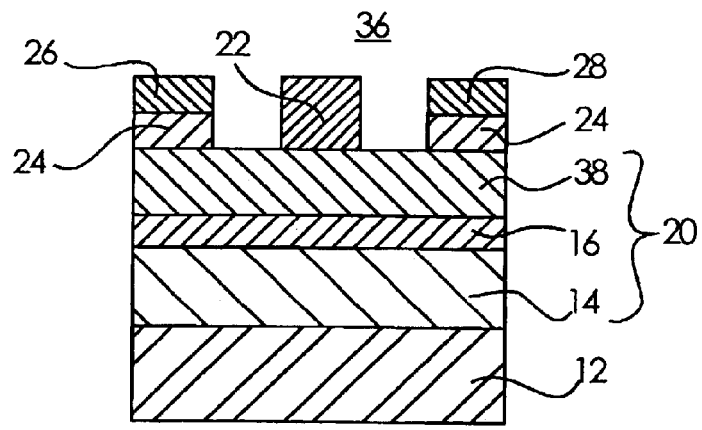
FIG. 4 is a cross-sectional view of a field effect transistor illustrative of one modification of an embodiment of the present invention.

FIG. 4 is a cross-sectional view of a field effect transistor illustrative of one modification of an embodiment of the present invention.

In FIG. 4, the MESFET 36 is different from the MESFET 10 shown in FIG. 1 in that the MESFET 36 takes an Al composition ratio x of AlGaAs of an electron supply layer 16 as $x \geq 0.27$ and makes use of an n-In0.5Ga0.5P channel layer 38 as an alternative to the n-GaAs channel layer 18 of the MESFET 10. The MESFET 36 is identical to the MESFET 10 in other configuration.

Even when the n-In0.5Ga0.5P channel layer 38 is used, the channel layer 38 is set in such a manner that its layer thickness Tc ranges from 10 nm to 50 nm, a doping impurity is taken as Si, and an impurity doping density thereof ranges from about $5E16$ $cm^{-3}$ to about $1E18$ $cm^{-3}$.

Also the electron supply layer 16 simply varies slightly in Al composition ratio and is identical to the MESFET 10 in other condition. The Al composition ratio is limited because lattice matching with In0.5Ga0.5P and the expression (1) have been taken into consideration.

Therefore, the relationships among the expressions (1), (2) and (3) are satisfied even in the configuration of the MESFET 36.

Since In0.5Ga0.5P of the MESFET 36 is large in bandgap energy and its critical breakdown voltage becomes high, a field effect transistor suitable for high-voltage operation can be configured.

Modification 3

Figure 5:
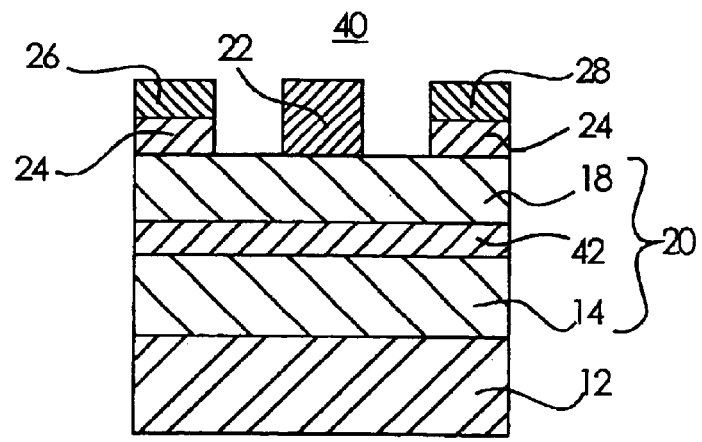
FIG. 5 is a cross-sectional view of a field effect transistor showing one modification of an embodiment according to the present invention.

FIG. 5 is a cross-sectional view of a field effect transistor showing one modification of an embodiment according to the present invention.

In FIG. 5, the MESFET 40 is different from the MESFET 10 shown in FIG. 1 in that the MESFET 40 takes an Al composition ratio x of AlGaAs of a buffer layer 14 as $x \geq 0.27$ and makes use of an n-In0.5Ga0.5P electron supply layer 42 as an alternative to the n-AlGaAs electron supply layer 16 of the MESFET 10. The MESFET 40 is identical to the MESFET 10 in other configuration.

The electron supply layer 42 is one in which a doping impurity is taken as Si, an impurity doping density Nde thereof ranges from $1E17$ $cm^{-3}$ to $1E18$ $cm^{-3}$, more preferably, $1.5E17$ $cm^{-3}$ to $5E17$ $cm^{-3}$, and its layer thickness Te ranges from about 1 nm to about 10 nm.

Further, the buffer layer 14 simply varies slightly in Al composition ratio and is identical to the MESFET 10 in other condition. The Al composition ratio is limited because lattice matching with In0.5Ga0.5P and the expression (1) have been taken into consideration.

Therefore, the relationships among the expressions (1), (2) and (3) are satisfied even in the configuration of the MESFET 40.

Since In0.5Ga0.5P employed in the electron supply layer 42 has no DX center in the MESFET 40, the supply of electrons is made stable and there is no instability upon its operation. Thus, a high-reliable field effect transistor can be configured.

Modification 4

Figure 6:
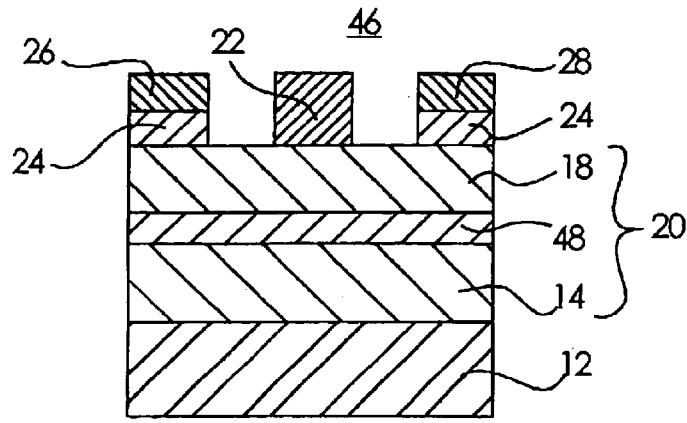
FIG. 6 is a cross-sectional view of a field, effect transistor showing one modification of an embodiment according to the present invention.

FIG. 6 is a cross-sectional view of a field effect transistor showing one modification of an embodiment according to the present invention.

In FIG. 6, the MESFET 46 is different from the MESFET 10 shown in FIG. 1 in that the MESFET 46 makes use of an n-In0.52Al0.48P electron supply layer 48 as an alternative to the n-AlGaAs electron supply layer 16 of the MESFET 10. The MESFET 46 is identical to the MESFET 10 in other configuration.

The electron supply layer 48 is one in which a doping impurity is taken as Si, an impurity doping density Nde thereof ranges from 1E17 $cm^{-3}$ to 1E18 $cm^{-3}$, more preferably, 1.5E17 $cm^{-3}$ to 5E17 $cm^{-3}$, and its layer thickness Te ranges from about 1 nm to about 10 nm.

Therefore, the relationships among the expressions (1), (2) and (3) are satisfied even in the configuration of the MESFET 46.

Since In0.52Al0.48P employed in the electron supply layer 48 has no DX center in the MESFET 46 in a manner similar to In0.5Ga0.5P, the supply of electrons is made stable and there is no instability upon its operation. Thus, a high-reliable field effect transistor can be configured.

Second Embodiment

Figure 7:
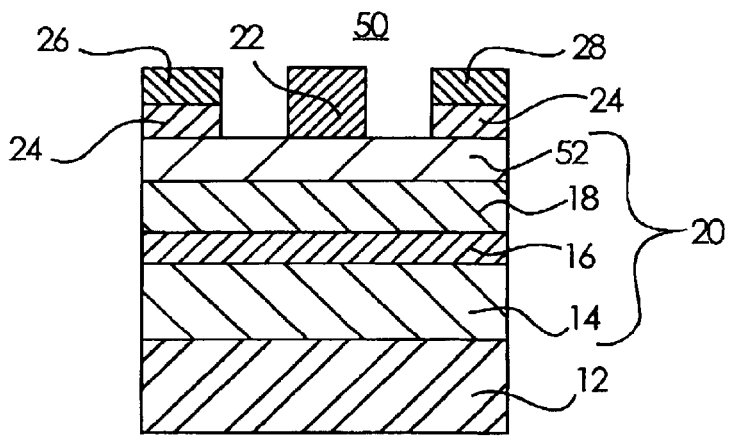
FIG. 7 is a cross-sectional view of a field effect transistor according to an embodiment of the present invention.

FIG. 7 is a cross-sectional view of a field effect transistor according to an embodiment of the present invention.

In FIG. 7, the MESFET 50 is different from the MESFET 10 shown in FIG. 1 in that the MESFET 50 is one wherein an n-AlGaAs layer 52 used as a fourth compound semiconductor layer is further placed on the channel layer 18 of the semiconductor laminated structure 20 of the MESFET 10 to thereby form a semiconductor laminated structure 20.

The n-AlGaAs layer 52 is not necessarily limited to the n conductivity type but may be formed as a non-doped AlGaAs layer.

Then, a gate electrode 22 is Schottky-bonded onto the surface of the n-AlGaAs layer 52. A source electrode 26 and a drain electrode 28 are disposed on a contact layer 24 placed on the surface of the n-AlGaAs layer 52 with being opposite to each other on both side of the gate electrode 22. Further, they are ohmic-bonded onto the surface of the contact layer 24.

A method of manufacturing the MESFET 50 is roughly identical to that for the MESFET 10. However, when the semiconductor laminated structure 20 is formed, the n-AlGaAs layer 52 is further formed on its corresponding n-GaAs layer used as the channel layer 18. Further, the present method is different from the MESFET 10 in that the n-AlGaAs layer 52 is used as an etching stopper layer upon etching the contact layer 24.

Figure 8:
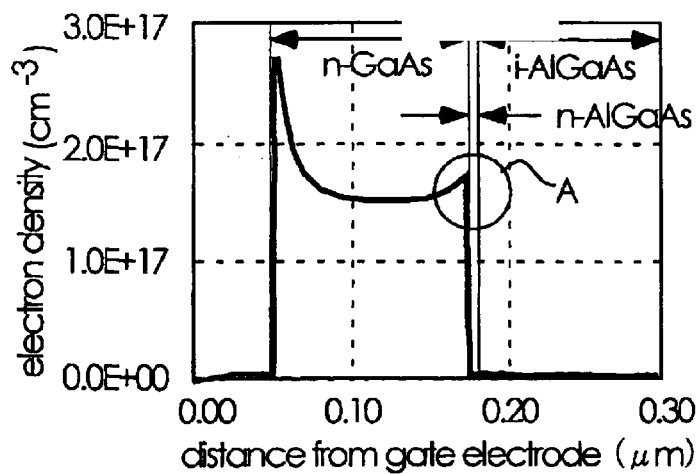
FIG. 8 is a graph showing an electron density distribution obtained in the semiconductor laminated structure of the field effect transistor according to an embodiment of the present invention.

FIG. 8 is a graph showing an electron density distribution obtained in the semiconductor laminated structure of the field effect transistor according to an embodiment of the present invention.

Since the MESFET 50 according to the present embodiment is also identical to the MESFET 10 according to the first embodiment in terms of the configurations of the buffer layer 14, the electron supply layer 16 and the channel layer 18, the channel layer 18 become similarly high in electron density in the vicinity of the interface between the channel layer 18 and the electron supply layer 16. This portion corresponds to a portion A surrounded by a circle in the graph shown in FIG. 8.

Thus, the MESFET 50 has the same effect as that held in the MESFET 10 according to the first embodiment. Further, since the gate electrode 22 is disposed on the n-AlGaAs layer 52, a Schottky barrier is enhanced as compared with the case in which the gate electrode 22 is disposed on the n-GaAs layer of the channel layer 18. By extension, a field effect transistor having a high backward withstand voltage can be configured.

Although Si has been used as the n-type doping impurity in the above description, Se or the like may be used in addition to the above.

Although a description has been made of the field effect transistor in which no recess structure is included in the channel layer, other type of field effect transistor such as a field effect transistor having a recess structure also has a similar effect.

Since the field effect transistor according to the present invention has such a configuration as described above, it has the following advantageous effects.

The field effect transistor according to the present invention comprises a semi-insulating semiconductor substrate; a semiconductor layer structure provided on the semiconductor substrate, the semiconductor layer structure including a non-doped first compound semiconductor layer, an n-type second compound semiconductor layer having an impurity doping density ranging from $1 \times 10^{17}$ $cm^{-3}$ to $1 \times 10^{18}$ $cm^{-3}$ and a layer thickness ranging from 1 nm to 10 nm and having an energy level at a lower end of a conduction band thereof, which is less than or equal to an energy level at a lower end of a conduction band of the first compound semiconductor layer, and an n-type third compound semiconductor layer having an energy level at a lower end of a conduction band thereof, which is less than the energy level at the lower end of the conduction band of the second compound semiconductor layer, the non-doped first compound semiconductor layer, the n-type second compound semiconductor layer and the n-type third compound semiconductor layer being sequentially disposed on the semiconductor substrate from the semiconductor substrate side; and a gate electrode disposed on the semiconductor layer structure, and a source electrode and a drain electrode, the source electrode and the drain electrode being opposite to each other with the gate electrode interposed therebetween and being disposed over the semiconductor layer structure. Owing to the configuration referred to above, the second compound semiconductor layer is perfectly depleted. To this end, electrons in the second compound semiconductor layer are diffused into the third compound semiconductor layer side in the neighborhood of an interface between the second compound semiconductor layer and the third compound semiconductor layer. Thus, an electron density distribution at the third compound semiconductor layer in the vicinity of the interface between the second compound semiconductor layer and the third compound semiconductor layer is enhanced.

Therefore, degradation in linearity of mutual conductance (gm) is suppressed even in a bias voltage region in which the absolute value of a gate bias corresponding to a negative voltage becomes large and thereby reaches near pinch off. Further, a satisfactory value of drain conductance (gd) can be obtained.

By extension, a high output amplifier good in amplifying characteristic and having less distortion can be provided at low cost in the simple configuration that an electron supply layer is interposed between a buffer layer and a channel layer.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A field effect transistor, comprising:

a semi-insulating semiconductor substrate;

a semiconductor layer structure provided on the semiconductor substrate, said semiconductor layer structure including a non-doped first compound semiconductor layer, an n-type second compound semiconductor layer having an impurity doping density ranging from $1\times10^{17}$ cm$^{-3}$ to $1\times10^{18}$ cm$^{-3}$ and a layer thickness ranging from 1 nm to 10 nm and having an energy level at a lower end of a conduction band thereof, which is less than or equal to an energy level at a lower end of a conduction band of the first compound semiconductor layer, and an n-type third compound semiconductor layer having an energy level at a lower end of a conduction band thereof, which is less than the energy level at the lower end of the conduction band of the second compound semiconductor layer, said non-doped first compound semiconductor layer, said n-type second compound semiconductor layer and said n-type third compound semiconductor layer being sequentially disposed on the semiconductor substrate from the semiconductor substrate side; and a gate electrode disposed on the semiconductor layer structure, and a source electrode and a drain electrode, said source electrode and said drain electrode being opposite to each other with the gate electrode interposed therebetween and being disposed over the semiconductor layer structure.

2. The field effect transistor according to claim 1, wherein the first compound semiconductor layer is formed of AlGaAs, the second compound semiconductor layer is formed of AlGaAs, and the third compound semiconductor layer is formed of GaAs.

3. The field effect transistor according to claim 1, wherein said semiconductor layer structure further comprises a fourth compound semiconductor layer having an energy level at a lower end of a conduction band thereof, which exceeds the energy level at the lower end of the conduction band of the third compound semiconductor layer, on the third compound semiconductor layer.

4. The field effect transistor according to claim 3, wherein the fourth compound semiconductor layer is formed of AlGaAs.

* * * * *